United States Patent [19]

Lehning

[11] Patent Number: 5,336,947
[45] Date of Patent: Aug. 9, 1994

[54] DISCRIMINATOR DEVICE

[75] Inventor: Heinz Lehning, Nyon, Switzerland

[73] Assignee: Motorola, Inc., Schaumburg, Ill.

[21] Appl. No.: 15,375

[22] Filed: Feb. 9, 1993

[30] Foreign Application Priority Data

Feb. 20, 1992 [GB] United Kingdom ............... 9203587

[51] Int. Cl.$^5$ ......................................... H03K 5/153
[52] U.S. Cl. ..................................... 307/360; 307/350; 307/272.3
[58] Field of Search ............ 307/350, 360, 362, 272.3, 307/473

[56] References Cited

U.S. PATENT DOCUMENTS

| | | | |
|---|---|---|---|
| 3,683,284 | 8/1972 | Mueller | 307/360 |
| 3,787,735 | 1/1974 | DeWitte et al. | 307/360 |
| 4,023,046 | 5/1977 | Renirie | 307/360 |
| 4,571,547 | 2/1986 | Day | 307/360 |
| 4,581,544 | 4/1986 | Feldman | 307/350 |
| 4,945,261 | 7/1990 | Wright | 307/360 |

Primary Examiner—Timothy P. Callahan
Assistant Examiner—Toan Tran
Attorney, Agent, or Firm—Harry A. Wolin; Michael D. Bingham

[57] ABSTRACT

A discriminator device for discriminating between two types of signal applied to an input port (EN), the first type being a binary logic signal having high and low values, and the second type of signal being a continuously variable signal or a floating voltage, the device including a voltage divider network (R1,R2) for coupling to the input port and a voltage supply (VCC) in order to provide a format signal, a second voltage divider network (R3,R4,R5) providing first and second voltage reference signals (VR1,VR2) having values intermediate the high and low values of the binary logic signal, comparators (34A, 34B) coupled to receive the format signal and the voltage reference signals, the outputs of the comparators being coupled to an output logic circuit (36-39) which provides a logic output signal of a value depending on the type of signal present at the input port.

10 Claims, 6 Drawing Sheets

DISCRIMINATOR DEVICE

FIELD OF THE INVENTION

The present invention relates to a discriminator device for discriminating between two types of signal. A preferred embodiment of the invention relates to a circuit for use in data receiver circuits for identifying the bus format of received data.

BACKGROUND ART

The I$^2$C or IIC bus is a standard bus (see "I$^2$C Bus Specification" Philips, January 1983) for transmitting data, and is a synchronous serial bus consisting of a Clock (SCL) and Data (SDA) line.

The 3-wire bus is another standard bus which is commonly used (for example, see the data sheet for Motorola part no. MC145170, PLL frequency synthesizer). The bus is also a synchronous serial bus having a clock which, in addition to clock and data lines, has an ENABLE line to permit data transfer.

With increasing use of multi standard systems, e.g. televisions, video devices, which can operate with a variety of standards, it would be desirable to provide a relatively simple means, for incorporation into a receiver or peripheral device, which can accept and discriminate between I$^2$C and 3-wire bus formats.

SUMMARY OF THE INVENTION

In consideration of the above, the present invention starts from the recognition that the ENABLE line of the 3-wire bus provides a means of discriminating between I$^2$C and 3-wire bus formats in a receiver device which is intended to receive data in either format; in the I$^2$C mode the ENABLE pin is left floating.

The present invention provides a discriminator for a receiver (peripheral) device for discriminating between data transmitted to the device in I$^2$C or 3-wire bus formats, the circuit including a voltage divider network for coupling to a power supply and an ENABLE pin of the device, the voltage divider network providing a format signal, means providing first and second voltage reference signals having values intermediate high and low logic values of signals on said ENABLE pin, comparator means coupled to receive the format signal and the reference signals, the outputs of the comparator means being coupled to output means which provides an output signal of a logic level depending on whether said format signal has a high or low logic value or an intermediate voltage value.

Thus, in accordance with the invention a means is provided for discriminating between I$^2$C and 3-wire bus formats: the 3-wire bus format will provide on the ENABLE pin a high or low logic value which will override the voltage divider network and provide said format signal. The format signal will be compared by the comparator with the reference signals, and being found greater or smaller than the reference signals, an output signal will be provided by the output means indicating that the 3-wire bus format is present.

In the case of I$^2$C bus format, since the ENABLE signal is not present and the pin is left floating, the voltage divider network will provide a format signal having a value intermediate said first and second reference voltages, which will result in the comparator enabling the output means to provide a signal value indicating that the I$^2$C bus format is present.

The present invention has more general use, as will be described below, in a variety of applications. The present invention provides in a more general aspect discriminator device for discriminating between two types of signal applied to an input port, the first type being a binary logic signal having high or low values, and the second type of signal being a continuously variable signal or a floating voltage, the device comprising a voltage divider network for coupling to the input port and a voltage supply in order to provide a format signal, means providing first and second voltage reference signals having values intermediate the high and low values of the binary logic signal, comparator means coupled to receive the format signal and the voltage reference signals, the output of the comparator means being coupled to output means which provides a logic output signal of a value depending on the type of signal present at the input port.

BRIEF DESCRIPTION OF THE DRAWINGS

Preferred embodiments of the invention will now be described with reference to the accompanying drawings wherein:

FIGS. 4-1 and 4-2 are a full circuit diagram of the bus receiver circuit; and

DESCRIPTION OF THE PREFERRED EMBODIMENTS

Figure 1:
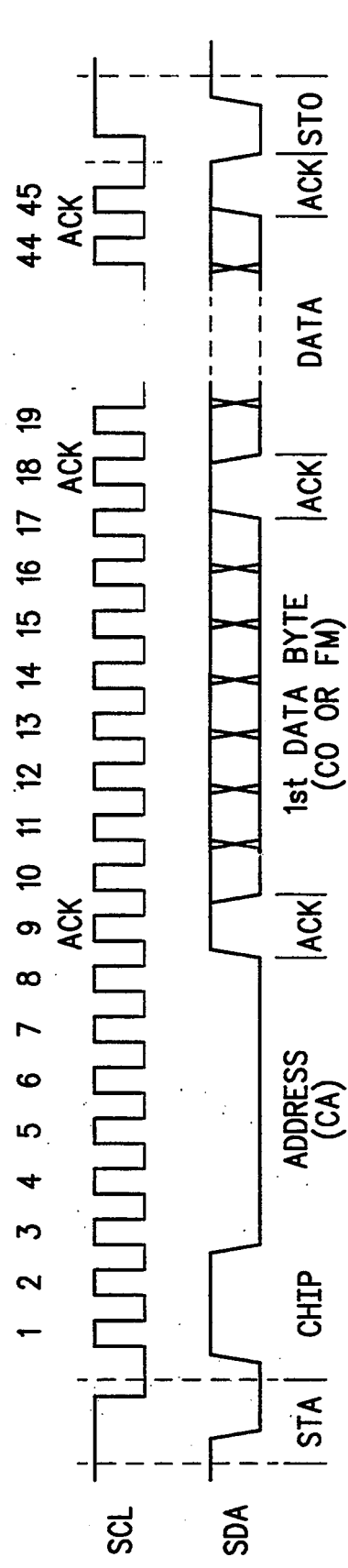
FIG. 1 is a timing diagram of I$^2$C and 3-wire bus data formats.
Figure 1:
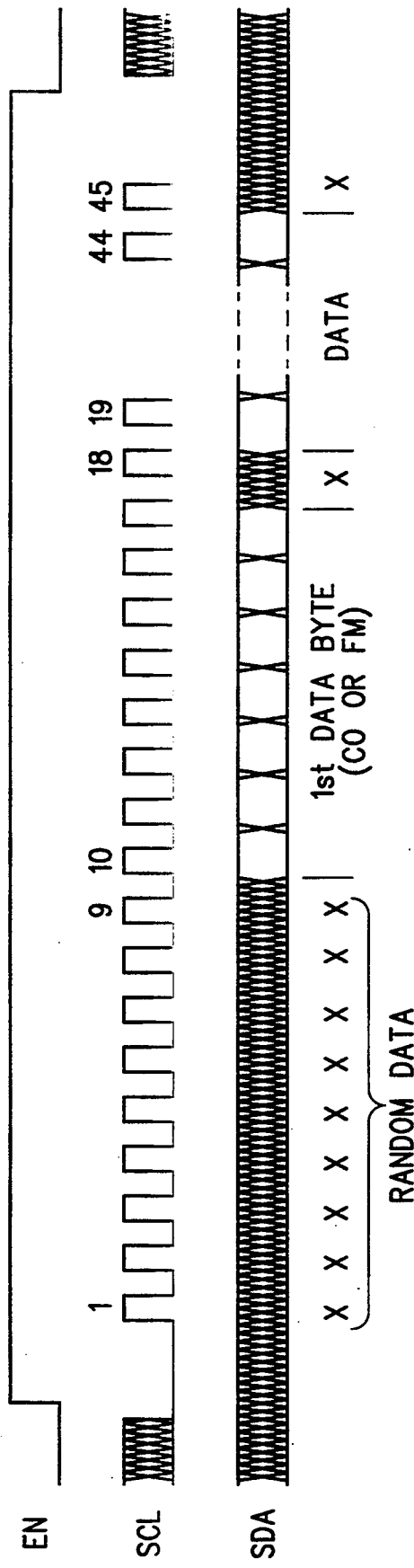

Referring now to the drawings, FIG. 1 shows the data format of the characteristic I$^2$C bus and 3-wire bus. It can be seen for the I$^2$C bus there is a start condition (STA) at the beginning of a data transmission in which the data line (SDA) goes low while the clock line (SCL) is high. Following this, SDA has a chip address which is 8 bits long. This is followed by an acknowledge bit which is generated by the receiver circuit and then data is transferred in 8 bit bytes with an acknowledge bit in between each bit.

For the 3-wire bus, it may be seen that at the start of a data transmission, an ENABLE signal changes state, as shown by going from a low to high logic value. The ENABLE signal is effectively a chip address signal, and where several chips are connected on the same data and clock lines to a transmitting device (e.g. MPU), separate ENABLE lines will be coupled to the individual chips for selectively enabling a chip. In this embodiment, the first part of the data put out on the 3-wire bus consists of random data (the first 9 bits) and then data is sent out in 8 bit bytes. It will be noted there is no chip address information sent out, and neither is an acknowledge bit generated within the circuit; this bit is just left random.

Figure 2:
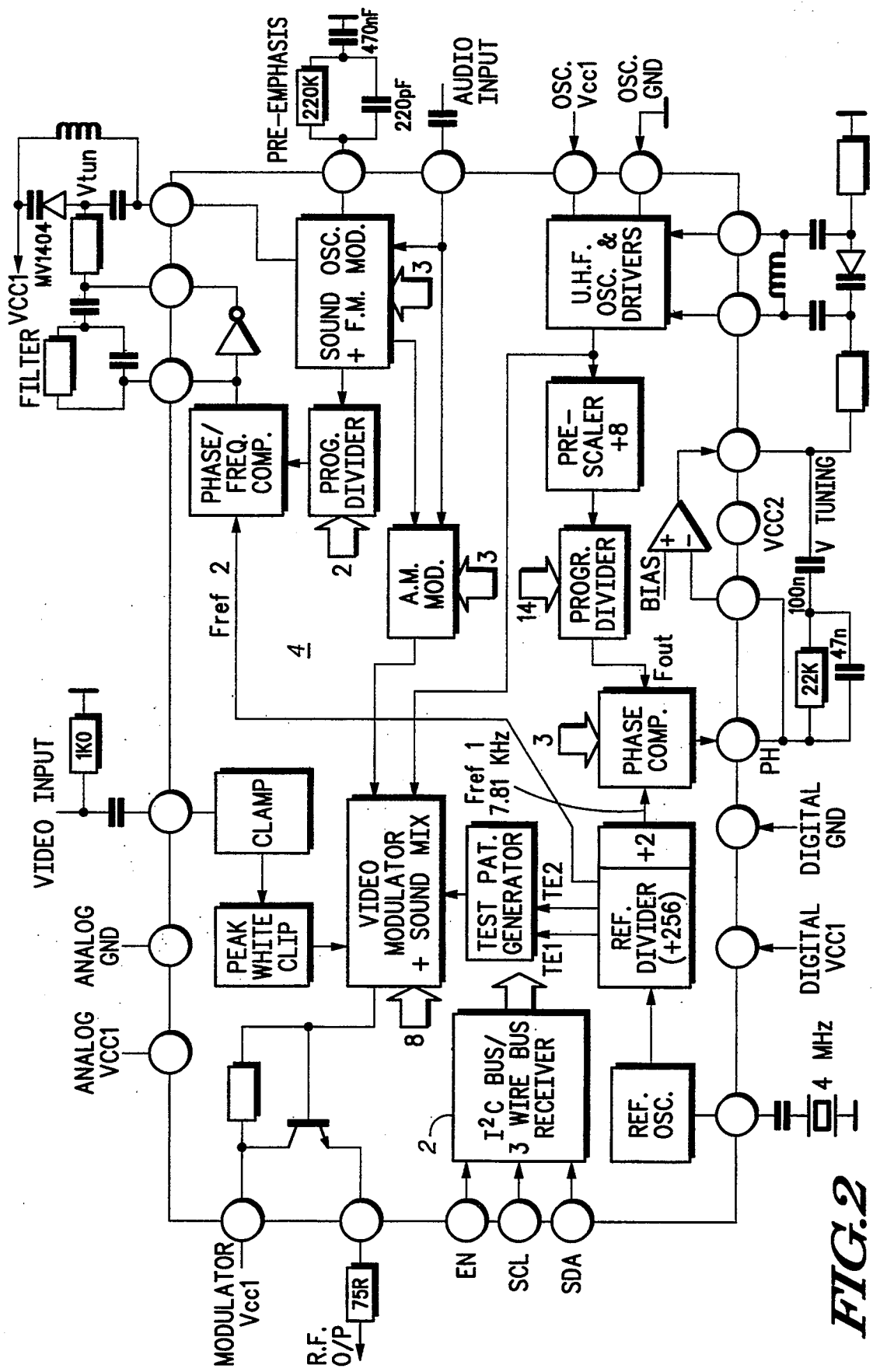
FIG. 2 is a schematic diagram of a modulator device for receiving input data signals on I$^2$C or 3-wire format and including a bus receiver circuit incorporating the invention.

Referring now to FIG. 2, this shows a modulator circuit for an audio/video modulator intended for use in VCR and satellite receiver applications. The circuit will not be described in detail since it is merely desired to show that the receiver is designed to operate with various standards, and an on-chip bus receiver 2 is included for receiving either I$^2$C or 3-wire data formats. The receiver is used to set the channel, which is tuned by a phase locked loop generally indicated at 4 over a wide range in the UHF bands.

It will be noted the bus receiver circuit 2 is coupled to ENABLE, clock, (SCL), and data (SDA) pins of the chip.

Figure 3:
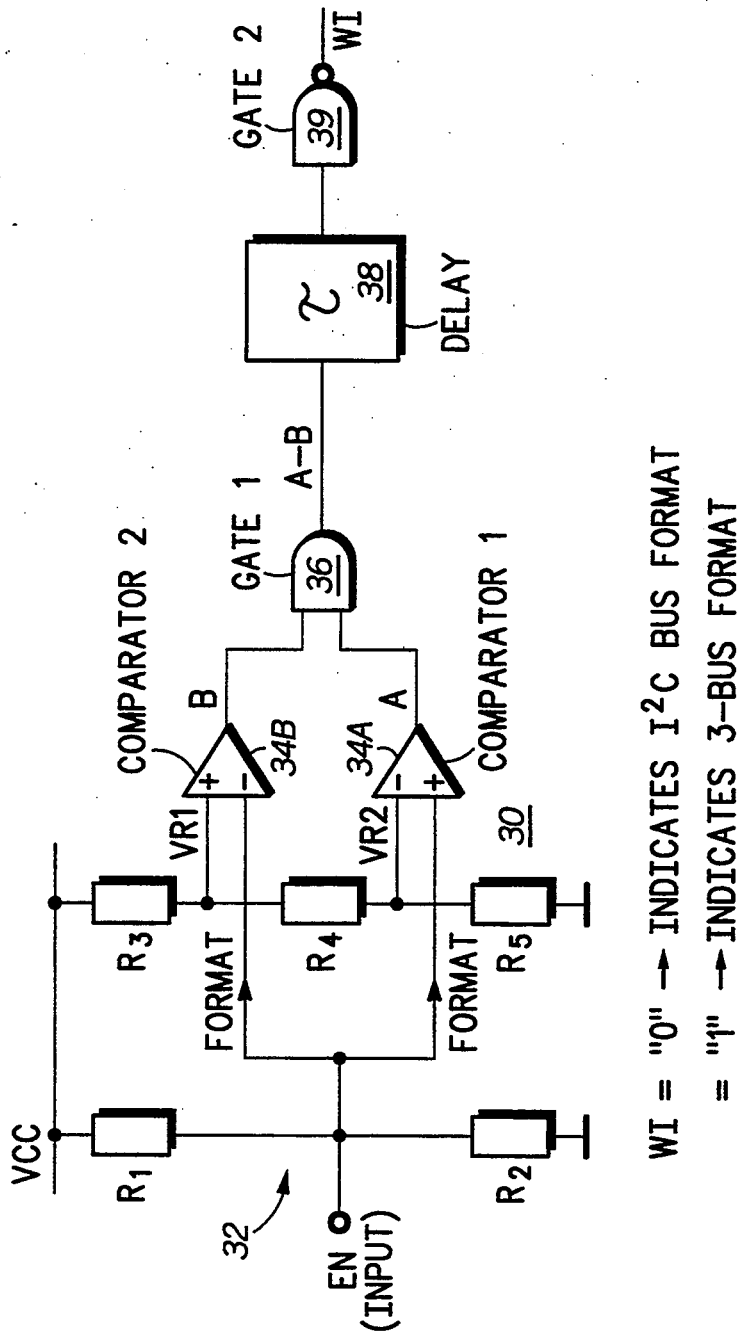
FIG. 3 is a circuit diagram of a window detection portion of the bus receiver circuit.

Referring now to FIG. 3, this shows a discriminator circuit 30 incorporated in the bus receiver circuit of FIG. 2. The discriminator circuit comprises a voltage divider arrangement 32 comprising first and second resistances R1, R2, their nodal connection being connected to the ENABLE pin in order to provide a FORMAT signal. A second chain of resistances R3, R4, R5 provide a first voltage reference signal VR1 and second voltage reference signal VR2. First and second comparator 34a, 34b are provided. The inverting input of comparator 34a is connected to receive voltage reference signal VR2 and the non-inverting input of comparator 34a is connected to receive the FORMAT signal. The inverting input of comparator 34b is connected to receive the FORMAT signal and the non-inverting input of comparator 34b is connected to receive the first voltage reference signal VR1. The outputs of the comparators are applied to AND gate 36 as output signals A, B and the output of gate 36, A.B, is applied to a delay circuit 38 and then to a further inverting gate 39. A filter may be used in place of the delay circuit 38.

In operation, the reference signal VR1 and VR2 define a window typically centred around $V_{CC}/2$ (2.5 volts), say between 1 V–4 V.

If data arrives in the 3-wire bus format, the ENABLE signals switches between high and low levels and never stays in the window for longer than the delay time as defined by delay circuit 38. Thus, when the ENABLE signal is low, it will be less than the voltage reference signal VR2 and hence the output of comparator 34a will be low, whereas the output of comparator 34b will be high. Hence the output of gate 36 will be low. When the ENABLE signal is high, the output of comparator 34B is high whereas that of 34A is low. Hence the output of gate 36 will be low. In both cases, the output of gate 39 will therefore be high indicating that bus is in the 3-wire mode.

If data is received in the I²C mode, then the EN pin will be floating. The voltage divider R1, R2 will therefore provide a FORMAT signal of say $V_{CC}/2$ which is less than voltage reference signal VR1 and greater than voltage reference VR2. Hence both the inputs A, B of comparators 34a, 34b will be high and the output of gate 36 will similarly be high. Delay circuit 38 ensures that no transients affect operation and the output of inverting gate 39 goes low indicating that the bus is in I²C mode.

The bus format for the I²C bus mode has a chip address and an acknowledge bit as described above. In the 3-wire bus format these bits are inhibited and may be random during data transmission. In order to convert between the two modes therefore these differences need to be dealt with.

Figures 1, 4:
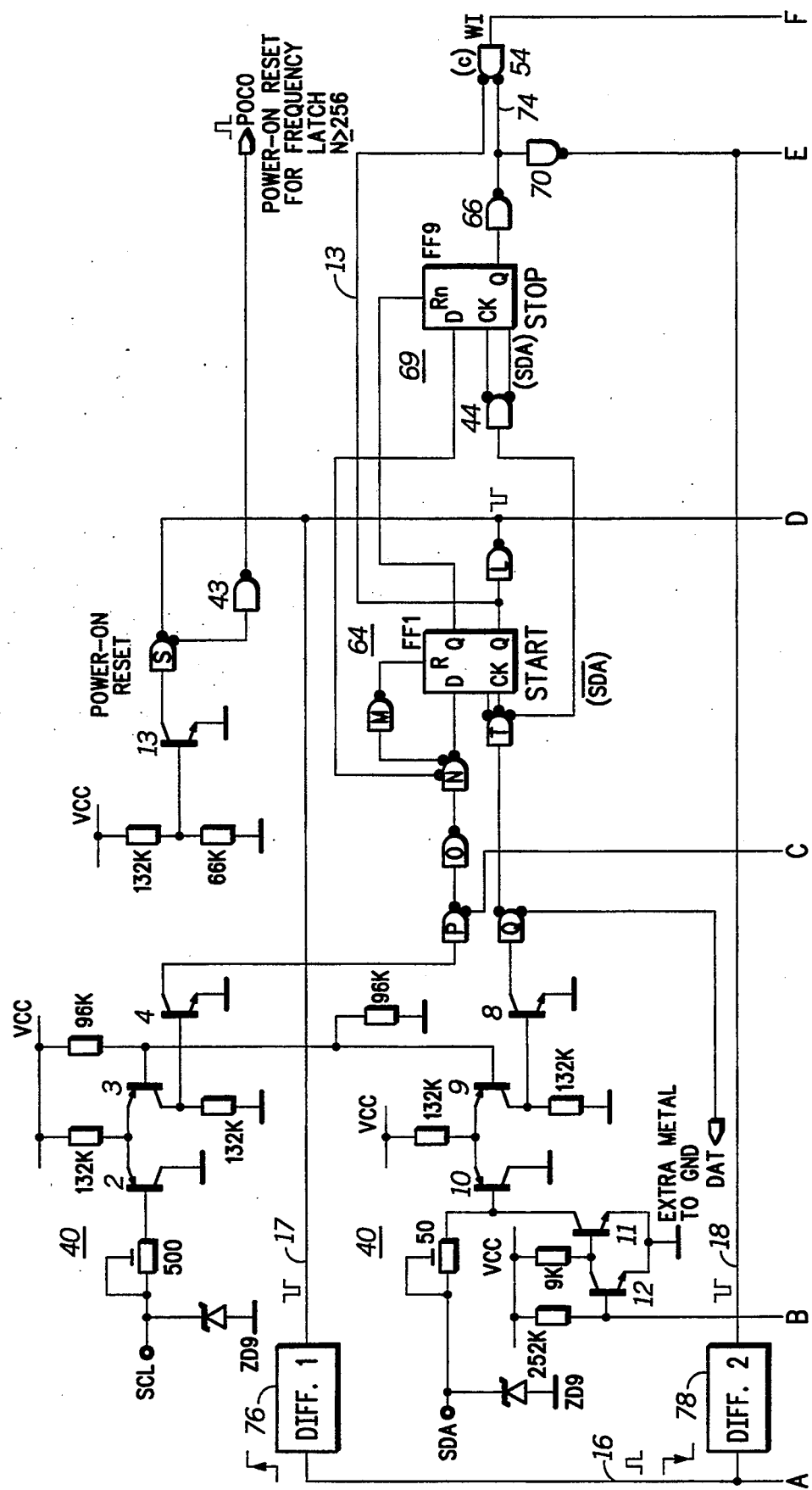
Figures 2, 4:
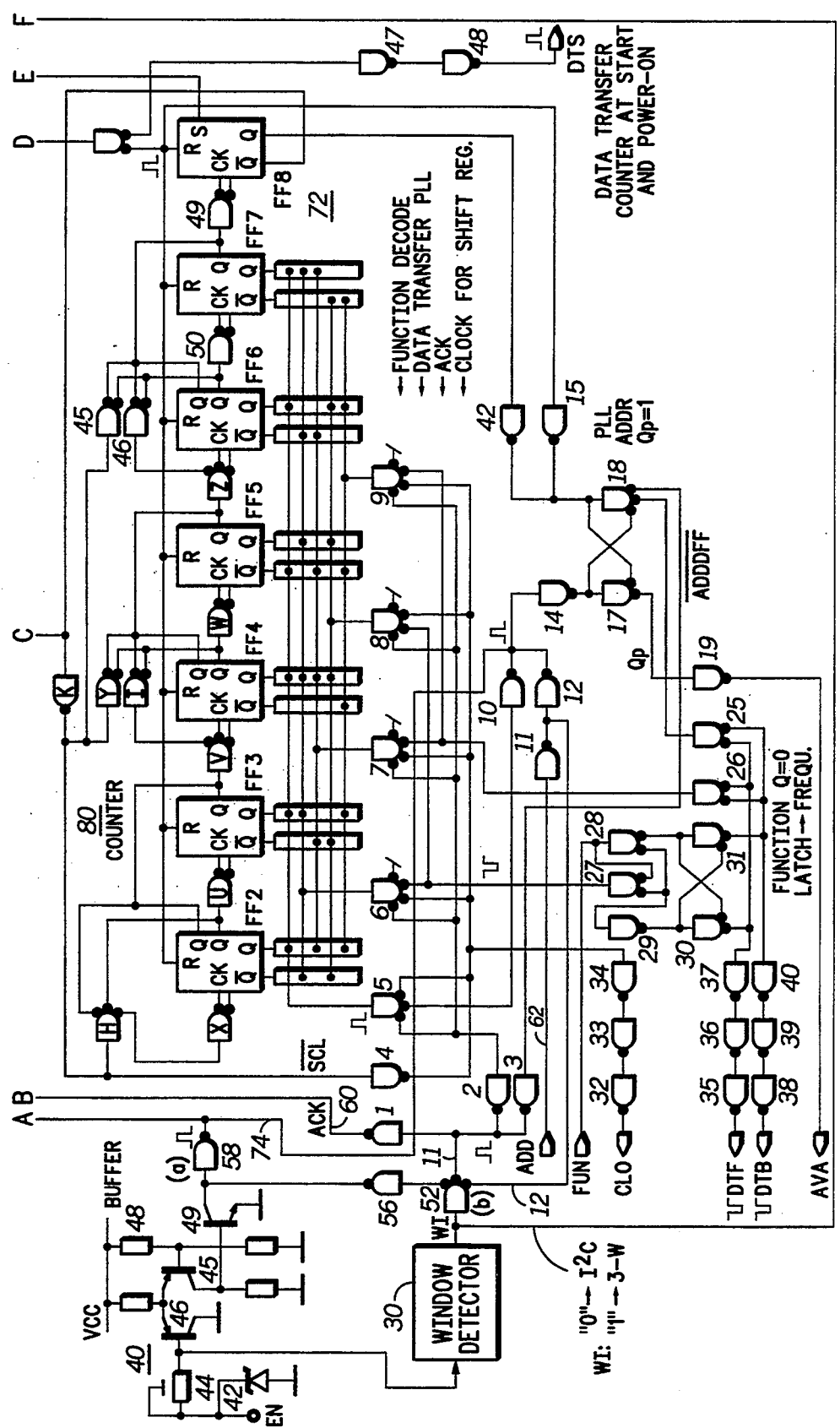

Referring now to FIG. 4, the bus receiver of FIG. 2 is shown in some detail. Only those parts of the circuit which are relevant to the present invention will be described, it being understood that the circuit provides various other functions which are not directly relevant to the present invention. Three pins are provided denoted SCL for clock signal, SDA for data signal and EN for enable signal. Various input and output signals are provided for connection to other parts of the circuit of FIG. 2 namely POCO (power on reset for frequency latch) DTS (data transfer counter at start and power on), DAT (data), ADD (address) and further control signals FUN, CLO, DTF, DTB and AVA. It will be noted that each of the pins EN, SCL, SDA has an input signal processing circuit 40 comprising a zener diode 42 and a preset resistor 44 and a level shifter comprising a pair of PNP transistors 46 in differential mode biassed by resistors 48 and coupled to an output bipolar transistor 49.

For pin EN, the output of resistor 44 is applied to the window detector circuit 30 (of FIG. 3) the output WI of which is applied to inverting gates 52, 54. A first output of gate 52 is applied to an inverting gate 56 the output of which is and wired in common with the output of processing circuit 40 to a further inverting gate 58. A second output of gate 52 is coupled to an acknowledge line ACK 60 of the receiver. A third output of gate 52 is coupled on line 74 to an address ADD input of the receiver 62. A first output of gate 54 is connected to start bit circuitry 64 and a second output of gate 54 is coupled in common with the output of an inverting gate 66 from stop bit circuitry 68 to the input of a further inverting gate 70, the output of which is coupled to counter circuitry 72.

The output of gate 58 is coupled at a first output line 74 to the ADD input 62 and is also coupled by a first positively going differentiator circuit 76 to a power on start circuitry 64, and via a second negative differentiator circuit 78 to stop circuitry 68.

In the I²C mode, the signal WI from window detector 30 is low and therefore the circuitry for the 3-wire bus format is deactivated and only the remainder of the circuit serving for I²C bus functions is active. A counter circuit 80 functions to provide timing for the acknowledge signal at the end of each byte of received data.

In the 3-wire bus mode, signal WI is high and hence gates 58, 52, 54 are operative and provide logic low signals. The second output of gate 52 coupled to line 60 is then operative to disable acknowledge pulses provided at the end of each data byte. The third output of gate 52 which is coupled to the ADD input 62 is operative to disable the address decoding, signal address from a shift register (not shown). The first output of gate 54 disables the pulse from the start detector 64 whereas the second output from gate 54 disables pulses from the stop detector.

The output of gate 58 is coupled to the address line by line 74 and replaces the address signal by the input enable signal. Differentiator 76 generates the pulse on the positive edge of the input enable signal. Its output signal replaces the start pulse of the I²C bus. The second differentiator 78 generates the pulse on the negative edge of enable signal. Its output signal coupled to the output of gate 70 replaces the stop pulse for the I²C mode.

There has thus been shown and described a simple and effective circuit for discriminating between I²C and 3-wire bus data formats and for providing a receiver circuit which responds to both types of data formats.

The present invention in its broadest aspect has application to other arrangements.

Figure 5:
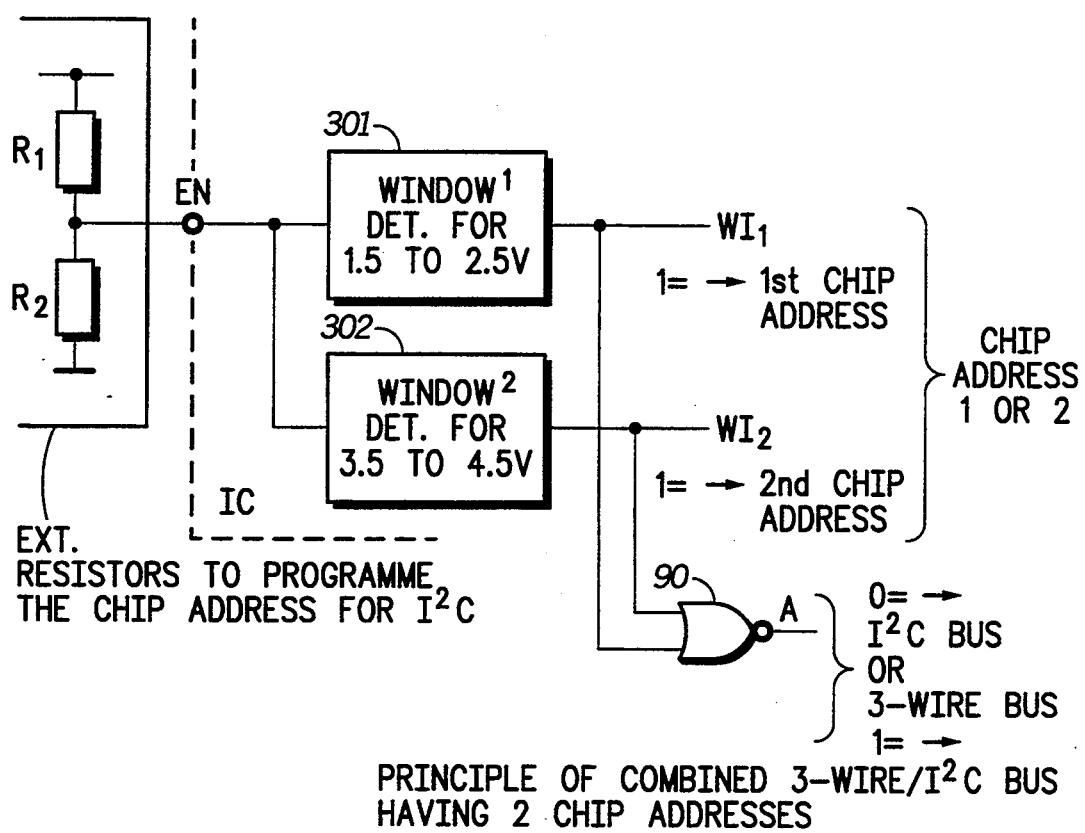
FIGS. 5 and 6 are schematic views of further applications of the present invention.

It is for example possible to combine an I²C bus with 3-wire and having two or more addresses on the I²C bus application. This is shown in FIG. 5.

In this case, a programmable voltage divider (P1, P2) is provided externally of a chip and connected to the enable pin EN. Divider P1, P2 is activated in I²C mode to provide a format signal of predetermined value (in contrast to the above embodiment where the format signal is determined by voltage divider 32 within the window detector). Two separate discriminator circuits 301, 302 are provided connected to the enable pin having voltage reference signals adjusted to provide "windows" of between 1.5 V and 2.5 V for circuit 301 and 3.5 V to 4.5 V for detector 302. The outputs of the window detectors 301, 302 inform the I²C bus receiver which one of the two addresses is valid and the combination of the two output signals connected to an NOR gate 90 informs the chip whether data is in I²C or 3-wire data format.

Thus, if the input voltage is within one of the windows for some time, either 1.5 V to 2.5 V, or 3.5 V to 4.5 V, the outputs of detectors 301, 302 will go high to indicate the chip address to the I²C bus receiver. The output of NOR gate 90 will give a low state indicator for I²C bus generation. If however both outputs of detectors 301, 302 are low, the outputs of NOR gate 90 goes high indicating the presence of the 3-wire bus format.

In a similar way, more than two window detectors can be used to decode more than two addresses.

Figure 6:
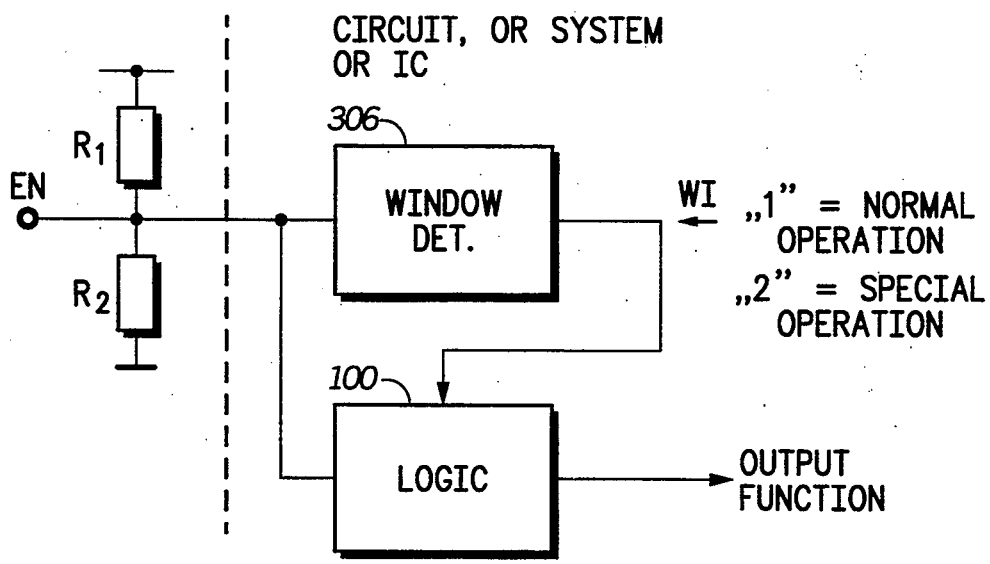

Referring to FIG. 6, a further embodiment is shown wherein an EN pin of an IC or other circuit or system may have any logic function including the ENABLE function for the 3-wire bus. The EN pin is connected to voltage divider R1, R2 (fulfilling the same function of voltage R1, R2 of FIG. 3) which is coupled to window detector 306. The FORMAT signal from voltage divider R1, R2 is also applied to a logic device 100, and the output of window detector 306 is applied to a control input of logic device 100.

Should the EN pin go open circuit or floating (e.g. a cable connection breaks, or for an I²C bus configuration, the cable connection is not present) the output WI of the window detector changes the state of the logic device 100, for example to a "limp home" mode.

Logic 100 may be switchable to more than one additional state by the use of two or more window detectors, in the manner indicated in FIG. 5, wherein each window detector provides a control input to the logic devices.

Thus, when the normal digital input signal is present at the EN pin with defined high and low levels then the window detector indicates that digital information is present.

If there is no digital signal, the window detector indicates, that the circuit or system has to switch into some different mode of operation. If there are two or more window detectors the different mode operation is switchable; for example the way to release the "limp home" function may be different in the two modes of operation (for different customers). In order that the IC is the same for all customers, the external voltage divider R1, R2 determines which "limp home" function may be enabled.

The present invention may also be used to combine analog and digital input functions on one pin. In this case switching between high and low levels means logic input operation (W1=1)p; for example, high state >4.5 V and low state <0.5 V. If however the signal is continuously in the window defined by the discriminator, this indicates an analog signal present. The analog voltage range in this case would be limited to say 1 V to 4 V to provide 0.5 V safety margin.

The window detector may be applied to more than one pin of a circuit or system. Combining the results of more pins can provide a higher number of combinations (for example 16, if each of 2 pins has four window detectors).

This principle applied to a PLL circuit or a modulator circuit would allow for example the following:

both inputs switch between high and low only: I²C bus operation.

same or none of the pins goes to high or low levels: a specific operation, for example the programming of 16 predetermined TV channels (division ratios) of the PLL system.

A potentiometer applied to the pins (one each) or resistors could do the selection.

I claim:

1. A discriminator device for discriminating between two types of signal applied to an input port, the first type being a binary logic signal having high and low values, and the second type of signal being a continuously variable signal or a floating voltage, the device comprising a voltage divider network for coupling to the input port and a voltage supply in order to provide a format signal, means providing first and second voltage reference signals having values intermediate the high and low values of the binary logic signal, comparator means coupled to receive the format signal and the voltage reference signals, an output of the comparator means being coupled to output means which provides a logic output signal of a value depending on the type of signal present at the input port.

2. A device as claimed in claim 1 wherein the means providing said first and second voltage reference signals includes a second voltage divider network for providing said first and second voltage reference signals.

3. A device as claimed in claim 1, wherein said comparator means comprise first and second comparators respectively, said first voltage reference signal being connected to the non-inverting input of the first comparator, said format signal being coupled to the inverting input of the first comparator and the non-inverting input of the second comparator, and the second voltage reference signal being coupled to the inverting input of the second comparator.

4. A device as claimed in claim 1, wherein the output means includes an AND gate for receiving the output of the comparator means.

5. A device as claimed in claim 1, wherein the output means includes a delay device such that transient signals of less than a predetermined time interval do not create an output signal.

6. A device as claimed in claim 1 wherein the output means includes an inverting gate providing said output signal.

7. A device as claimed in claim 1 incorporated in a data receiver, wherein data is supplied to the device over a bus in I²C or 3-wire bus format, and said input port is coupled to an ENABLE pin of the bus.

8. A circuit comprising at least two discriminator devices wherein each device discriminates between two types of signal applied to an input port, the first type being a binary logic signal having high and low values, and the second type being a continuously variable signal or a floating voltage, each device comprising a voltage divider network for coupling to the input port and a voltage supply in order to provide a format signal, means providing first and second voltage reference signals having values intermediate the high and low values of the binary logic signal, and comparator means coupled to receive the format signal and the voltage reference signals, an output of the comparator means being coupled to output means which provides a logic output signal of a value depending on the type of signal present at the input port, and a voltage divider network external to the circuit is included for providing a signal of selected value to selectively activate one of the discriminator devices.

9. A device as claimed in claim 8 wherein the output signal of said output means is coupled to a further logic device providing a predetermined function for setting the further device to one or more predetermined states.

10. A device as claimed in claim 9, wherein the output of each discriminator device is coupled to the further logic device for selectively activating the logic device in one of a plurality of operating modes.

* * * * *